United States Patent
Kondoh et al.

(10) Patent No.: US 8,822,246 B2
(45) Date of Patent: Sep. 2, 2014

(54) METHOD FOR MANUFACTURING A LIGHT-EMITTING ELEMENT INCLUDING A PROTECTIVE FILM FOR A CHARGE INJECTION LAYER

(75) Inventors: Tetsuro Kondoh, Osaka (JP); Kou Sugano, Osaka (JP); Seiji Nishiyama, Osaka (JP)

(73) Assignee: Panasonic Corporation, Osaka (JP)

( * ) Notice: Subject to any disclaimer, the term of this patent is extended or adjusted under 35 U.S.C. 154(b) by 426 days.

(21) Appl. No.: 13/205,765

(22) Filed: Aug. 9, 2011

(65) Prior Publication Data

US 2011/0291085 A1 Dec. 1, 2011

Related U.S. Application Data

(63) Continuation of application No. PCT/JP2010/000784, filed on Feb. 9, 2010.

(30) Foreign Application Priority Data

Feb. 10, 2009 (JP) .................. 2009-028969

(51) Int. Cl.
  *H01L 21/00* (2006.01)
  *H01L 51/50* (2006.01)
  *H01L 51/56* (2006.01)
  *H01L 27/32* (2006.01)

(52) U.S. Cl.
  CPC ............ *H01L 51/5088* (2013.01); *H01L 51/56* (2013.01); *H01L 27/3246* (2013.01)
  USPC .......................................................... 438/34

(58) Field of Classification Search
  CPC .................... H01L 33/44; H01L 33/38
  USPC ......................................................... 438/37
  See application file for complete search history.

(56) References Cited

U.S. PATENT DOCUMENTS

| 5,294,869 A | 3/1994 | Tang et al. |
| 5,443,922 A | 8/1995 | Nishizaki et al. |

(Continued)

FOREIGN PATENT DOCUMENTS

| EP | 2175504 | 4/2010 |
| JP | 05-163488 A | 6/1993 |

(Continued)

OTHER PUBLICATIONS

Extended European Search Report (EESR) in European Patent Application No. 10741078.9, dated Feb. 25, 2013.

(Continued)

*Primary Examiner* — Kevin Parendo
(74) *Attorney, Agent, or Firm* — Greenblum & Bernstein, P.L.C.

(57) ABSTRACT

A method for manufacturing a light-emitting element. An anode is formed on a main surface of a substrate. A hole-injection layer is formed at least above the anode. At least the hole-injection layer is covered with a protective film. A bank which is provided with an aperture through which a portion of the protective film is exposed, is formed on the protective film by a wet process. The portion of the protective film exposed through the aperture is removed so that a portion of the hole-injection layer is exposed, a light-emitting layer is formed on the hole-injection layer exposed through the aperture, and a cathode is formed above the light-emitting layer. The protective film is resistant to a fluid used during the wet process.

16 Claims, 12 Drawing Sheets

(56) References Cited

U.S. PATENT DOCUMENTS

| | | | |
|---|---|---|---|
| 5,688,551 | A | 11/1997 | Littman et al. |
| 6,132,280 | A | 10/2000 | Tanabe et al. |
| 6,197,733 | B1* | 3/2001 | Mikami et al. ............... 510/175 |
| 6,284,393 | B1 | 9/2001 | Hosokawa et al. |
| 6,309,801 | B1 | 10/2001 | Meijer et al. |
| 2002/0051894 | A1 | 5/2002 | Yoshikawa |
| 2002/0158835 | A1 | 10/2002 | Kobayashi et al. |
| 2003/0137242 | A1 | 7/2003 | Seki |
| 2004/0178414 | A1 | 9/2004 | Frey et al. |
| 2005/0064633 | A1 | 3/2005 | Mikoshiba |
| 2005/0170208 | A1 | 8/2005 | Yatsunami et al. |
| 2005/0208206 | A1 | 9/2005 | Yoshikawa |
| 2006/0008931 | A1 | 1/2006 | Lee et al. |
| 2006/0035469 | A1* | 2/2006 | Truong et al. ............... 438/739 |
| 2006/0204788 | A1 | 9/2006 | Yoshikawa |
| 2006/0243377 | A1 | 11/2006 | Matsuo et al. |
| 2006/0284166 | A1 | 12/2006 | Chua et al. |
| 2007/0029929 | A1 | 2/2007 | Nakamura et al. |
| 2007/0172978 | A1 | 7/2007 | Chua et al. |
| 2007/0241665 | A1 | 10/2007 | Sakanoue et al. |
| 2007/0290604 | A1 | 12/2007 | Sakanoue et al. |
| 2008/0150422 | A1 | 6/2008 | Ohara |
| 2008/0231179 | A1 | 9/2008 | Abe et al. |
| 2009/0085479 | A1* | 4/2009 | Ushikubo ............... 313/506 |
| 2009/0153033 | A1* | 6/2009 | Lee et al. ............... 313/504 |
| 2009/0160322 | A1 | 6/2009 | Yoshida et al. |
| 2009/0160325 | A1 | 6/2009 | Yatsunami et al. |
| 2009/0224664 | A1 | 9/2009 | Yoshida et al. |
| 2009/0236590 | A1* | 9/2009 | Ohsawa ............... 257/40 |
| 2009/0243478 | A1 | 10/2009 | Shoda et al. |
| 2009/0272999 | A1 | 11/2009 | Yoshida et al. |
| 2009/0284135 | A1 | 11/2009 | Yoshida et al. |
| 2009/0284141 | A1 | 11/2009 | Sakanoue et al. |
| 2009/0284144 | A1 | 11/2009 | Fujioka et al. |
| 2009/0284146 | A1 | 11/2009 | Yoshida et al. |
| 2010/0102310 | A1 | 4/2010 | Komatsu et al. |
| 2010/0213827 | A1 | 8/2010 | Yoshida et al. |
| 2010/0252857 | A1* | 10/2010 | Nakatani et al. ............... 257/100 |
| 2010/0258833 | A1 | 10/2010 | Okumoto et al. |
| 2010/0302221 | A1 | 12/2010 | Okumoto |
| 2011/0042703 | A1 | 2/2011 | Okumoto et al. |
| 2011/0140596 | A1 | 6/2011 | Yoshida et al. |
| 2012/0061656 | A1 | 3/2012 | Ohuchi et al. |
| 2012/0178191 | A1 | 7/2012 | Sakanoue et al. |

FOREIGN PATENT DOCUMENTS

| | | | |
|---|---|---|---|
| JP | 10-162959 | A | 6/1998 |
| JP | 2000-133446 | A | 5/2000 |
| JP | 2000-223276 | A | 8/2000 |
| JP | 2002-075661 | A | 3/2002 |
| JP | 2002-530881 | | 9/2002 |
| JP | 2002-318556 | A | 10/2002 |
| JP | 3369615 | B2 | 11/2002 |
| JP | 2003-007460 | | 1/2003 |
| JP | 2003-249375 | A | 9/2003 |
| JP | 2003-264083 | A | 9/2003 |
| JP | 2004-139746 | A | 5/2004 |
| JP | 2004-228355 | A | 8/2004 |
| JP | 2004-234901 | A | 8/2004 |
| JP | 2004-235128 | | 8/2004 |
| JP | 2004-527093 | A | 9/2004 |
| JP | 2004-363170 | | 12/2004 |
| JP | 2005-012173 | A | 1/2005 |
| JP | 2005-197189 | A | 7/2005 |
| JP | 2005-203339 | | 7/2005 |
| JP | 2005-203340 | A | 7/2005 |
| JP | 2005-267926 | A | 9/2005 |
| JP | 2005-268099 | A | 9/2005 |
| JP | 2005-331665 | | 12/2005 |
| JP | 2006-024573 | | 1/2006 |
| JP | 2006-114928 | A | 4/2006 |
| JP | 3789991 | B2 | 4/2006 |
| JP | 2006-185869 | A | 7/2006 |
| JP | 2006-253443 | A | 9/2006 |
| JP | 2006-294261 | A | 10/2006 |
| JP | 2006-344459 | A | 12/2006 |
| JP | 2007-073499 | A | 3/2007 |
| JP | 2007-095606 | A | 4/2007 |
| JP | 2007-214066 | A | 8/2007 |
| JP | 2007-527542 | A | 9/2007 |
| JP | 2007-287353 | | 11/2007 |
| JP | 2007-288071 | A | 11/2007 |
| JP | 2007-288074 | | 11/2007 |
| JP | 2008-041747 | A | 2/2008 |
| JP | 2008-053556 | A | 3/2008 |
| JP | 2008-091072 | | 4/2008 |
| JP | 2008-124268 | A | 5/2008 |
| JP | 2008-140724 | A | 6/2008 |
| JP | 2008-177557 | A | 7/2008 |
| JP | 2008-241238 | A | 10/2008 |
| JP | 2008-270731 | A | 11/2008 |
| JP | 2009-004347 | A | 1/2009 |
| JP | 2009-044103 | A | 2/2009 |
| JP | 2009-048960 | A | 3/2009 |
| JP | 2009-054582 | A | 3/2009 |
| JP | 2009-058897 | A | 3/2009 |
| JP | 2009-218156 | A | 9/2009 |
| JP | 2009-239180 | A | 10/2009 |
| JP | 2009-260306 | A | 11/2009 |
| JP | 2009-277590 | A | 11/2009 |
| JP | 2009-277788 | A | 11/2009 |
| JP | 2010-010670 | A | 1/2010 |
| JP | 2010-021138 | A | 1/2010 |
| JP | 2010-021166 | A | 1/2010 |
| JP | 2010-033972 | A | 2/2010 |
| JP | 2010-050107 | A | 3/2010 |
| JP | 2010-073700 | A | 4/2010 |
| JP | 2010-103374 | A | 5/2010 |
| JP | 2010-161070 | A | 7/2010 |
| JP | 2010-161185 | A | 7/2010 |
| JP | 2011-040167 | A | 2/2011 |
| WO | 2008/120714 | A1 | 10/2008 |
| WO | 2008/146470 | | 12/2008 |
| WO | 2008/149498 | | 12/2008 |
| WO | 2008/149499 | | 12/2008 |
| WO | 2010/032443 | A1 | 3/2010 |
| WO | 2010/032444 | A1 | 3/2010 |
| WO | 2010/058716 | A1 | 5/2010 |
| WO | 2010/070798 | A1 | 6/2010 |
| WO | 2010/092795 | A1 | 8/2010 |
| WO | 2010/092796 | A1 | 8/2010 |
| WO | 2010/092797 | A1 | 8/2010 |
| WO | 2011/021343 | A1 | 2/2011 |
| WO | 2012/017495 | A1 | 2/2012 |
| WO | 2012/017502 | A1 | 2/2012 |
| WO | 2012/017503 | A1 | 2/2012 |

OTHER PUBLICATIONS

Hyunbok Lee et al., "The origin of the hole injection improvements at indium tin oxide/molybdenum trioxide/N,N'-bis (1-naphthyl)-N,N'-diphenyl-1,1'-biphenyl-4,4'-diamine interface", Applied Physics Letters 93, 043308 (2008).

Kenji Koizumi et al., The electronic structure of alpha-NOD/MoO3 interface, Dai 56 kai Ouyou Butsurigaku Kankei Rengou Kouenaki Yokoushuu (Extended Abstracts for the 56th Spring Meeting of the Japan Society of Applied Physics and Related Societies), No. 3, 30p-ZA-11, The Japan Society of Applied Physics, p. 1279 (Apr. 2, 2009). Along with a verified English language translation.

Jingze Li et al., "Enhanced performance of organic light emitting device by insertion of conducting/insulating WO3 anodic buffer layer", Syntetic Metals 151, pp. 141-146 (2005).

Hiromi Watanabe et al., "Structure and Physical Property Evaluation of MoOX Thin-Film in Reactive Sputtering Method, and MoOX/α-NPD Boundary Analysis", (Nov. 20, 2008). Along with a verified English language partial translation.

Yasuo Nakayama et al., "MoO3 on F8BT Boundary Electron Structure: Research through Photoemission Spectrography and Meta-Stable Excited Atom Spectrometry", (Nov. 20, 2008). Along with a verified English language partial translation.

(56) References Cited

OTHER PUBLICATIONS

Min Jung Son et al., "Interface electronic structures of organic light-emitting diodes with WO3 interlayer: A study by photoelectron spectroscopy", Organic Electronics 10, pp. 637-642 (2009).

Kaname Kanai et al., "Electronic structure of anode interface with molybdenum oxide buffer layer", Organic Electronics 11, pp. 188-194 (2010).

F. Bussolotti et al, "Surface electronic properties of polycrystalline WO3 thin films: a study by core level and valence band photoemission", Surface Science 538, pp. 113-123 (2003).

Qin-Ye Bao et al., "Interfacial electronic structures of WO3-based intermediate connectors in tandem organic light-emitting diodes", Organic Electronics 11, pp. 1578-1583 (2010).

Th. Kugler et al., "Polymer band alignment at the interface with indium tin oxide: consequences for light emitting devices", Chemical Physics Letters 310, pp. 391-396 (1999).

I. N. Yakovkin et al., "Driving force for the WO3(001) surface relaxation", Surface Science 601, pp. 1481-1488 (2007).

J. B. Pedley et al., "Thermochemical Data for Gaseous Monoxides", Journal of Physical and Chemical Reference Data. vol. 12, No. 4, pp. 967-1032 (1983).

M. Stolze et al., "Nature of substoichiometry in reactively DC-sputtered tungsten oxide thin films and its effect on the maximum obtainable colouration by gases", Thin Solid Films 409, pp. 254-264 (2002).

V. Bulovic et al., "Transparent light-emitting devices", Nature, vol. 380, p. 29 (1996).

U.S. Appl. No. 13/205,778 to Kenji Harada et al., which was filed on Aug. 9, 2011.

International Search Report in PCT/JP2010/000784, dated Jun. 6, 2010.

\* cited by examiner

FIG. 7A
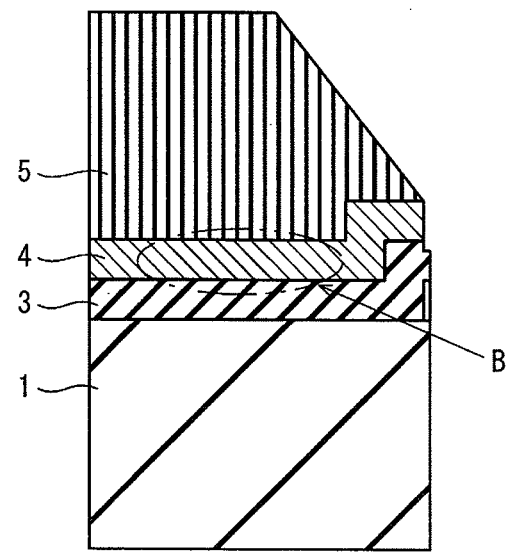
FIG. 7B
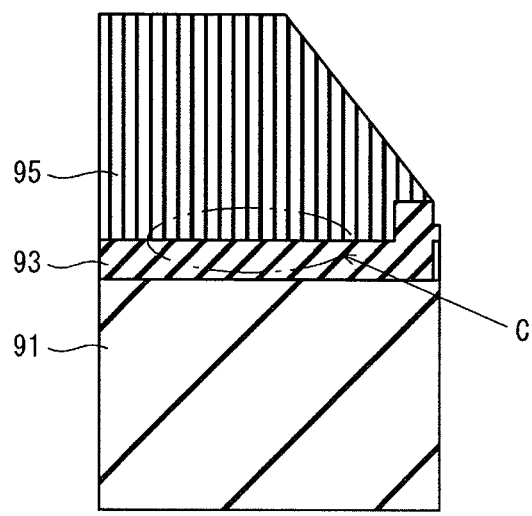
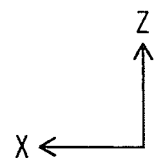

METHOD FOR MANUFACTURING A LIGHT-EMITTING ELEMENT INCLUDING A PROTECTIVE FILM FOR A CHARGE INJECTION LAYER

CROSS REFERENCE TO RELATED APPLICATIONS

This is a continuation application of PCT Application No. PCT/JP2010/000784 filed Feb. 9, 2010, and claims the benefit of priority from Japanese Patent Application No. 2009-028969, filed Feb. 10, 2009, designating the United States of America, the disclosure of which, including the specification, drawings and claims, is incorporated herein by reference in its entirety.

FIELD OF THE INVENTION

The present invention relates to a method for manufacturing light-emitting elements, light-emitting elements, a method for manufacturing light-emitting devices, and light-emitting devices.

DESCRIPTION OF THE RELATED ART

In recent years, progress has been made in the research and development of organic electroluminescent elements (hereinafter, "organic EL elements"), which are light-emitting elements that rely on the phenomenon of electroluminescence of solid-state fluorescent material. An organic EL element is composed of an anode, a cathode, and an organic light-emitting layer provided there between. A structure may be adopted in which a charge injection layer and/or a charge transport layer are layered between the anode and the organic light-emitting layer and between the cathode and the organic light-emitting layer.

In a conventional organic EL element, the charge injection layer and the like are formed from a conductive polymer such as PEDOT (an amalgam of polythiophene and polystyrene sulfonic acid). It has also been proposed to form the charge injection layer from a metal compound such as a transition metal oxide (see Patent Literature 1, for example). As compared to forming the charge injection layer from PEDOT, forming the charge injection layer from a metal compound has the advantages of excellent voltage-current density characteristics in the element and of not deteriorating easily even when a high current flows to achieve intense light emission.

The light-emitting layer is formed by the inkjet method, the printing method, or the like after banks that are grid-shaped, or line-shaped, are formed by a wet process on the charge injection layer or the charge transport layer formed on the anode.

PATENT LITERATURE

Patent Literature 1: Japanese Patent Application Publication No. 2005-203339

SUMMARY OF INVENTION

Even in a structure that adopts a metal compound for the charge injection/transport layer, there is a demand for further improvement in light-emitting characteristics.

The present invention has been conceived in light of the above demand, and it is an object thereof to provide a method for manufacturing light-emitting elements, light-emitting elements, a method for manufacturing light-emitting devices, and light-emitting devices, the elements and devices having strong light-emitting characteristics.

The following steps are performed in a method of manufacturing a light-emitting element according to an aspect of the present invention.

(First step) Forming a first electrode on one main surface of a substrate.

(Second step) Forming a layer including a metal compound above at least the first electrode.

(Third step) Covering at least the layer including the metal compound with a protective film.

(Fourth step) Forming banks by a wet process on the protective film, the banks defining an aperture through which a portion of the protective film is exposed.

(Fifth step) Removing the portion of the protective film exposed through the aperture so that a portion of the layer including the metal compound is exposed.

(Sixth step) Forming a light-emitting layer on the layer including the metal compound exposed through the aperture by performing the fifth step.

(Seventh step) Forming a second electrode of differing polarity than the first electrode above the light-emitting layer.

In the method of manufacturing a light-emitting element according to this aspect of the present invention, the protective film is resistant to a liquid used during the wet process in the fourth step.

In the method of manufacturing a light-emitting element according to this aspect of the present invention, the banks are formed with the layer including the metal compound (hereinafter referred to as the "metal compound layer") having been covered by the protective film. Furthermore, in the method of manufacturing a light-emitting element according to this aspect of the present invention, the protective film is resistant to the liquid used during the wet process in the fourth step. Therefore, in the method of manufacturing a light-emitting element according to this aspect of the present invention, the metal compound layer, the upper surface of which is covered by the protective film, is not corroded by the wet process in the fourth step.

Therefore, in the method of manufacturing a light-emitting element according to this aspect of the present invention, the thickness of the metal compound layer is guaranteed to a high degree of accuracy, thus allowing for the manufacture of a light-emitting element having strong light-emitting characteristics.

Moreover, in the method of manufacturing a light-emitting element according to this aspect of the present invention, as described above, while the wet process in the fourth step is being performed, the upper surface of the metal compound layer is covered by the protective film, and after completion of the wet process in the fourth step, a portion of the protective film is removed (fifth step), and the light-emitting layer is then layered thereon (sixth step). Therefore, no impurities due to formation of the banks are located between the metal compound layer and the light-emitting layer.

Accordingly, in the method of manufacturing a light-emitting element according to this aspect of the present invention, no impurities are located between the metal compound layer and the light-emitting layer, thus allowing for the manufacture of a light-emitting element having strong light-emitting characteristics.

In summary, the method of manufacturing a light-emitting element according to this aspect of the present invention allows for the manufacture of a light-emitting element having strong light-emitting characteristics.

BRIEF DESCRIPTION OF DRAWINGS

FIGS. 7A and 7B are schematic cross-section diagrams showing a detailed structure of the light-emitting device 100 at a lower section of the banks 5;

DESCRIPTION OF EMBODIMENTS

Figure 1A:
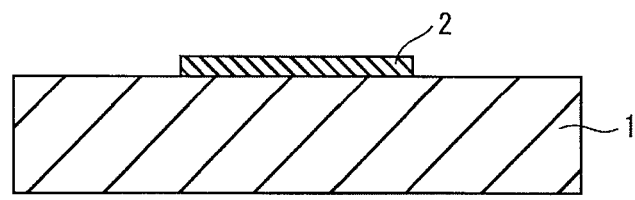
FIGS. 1A-1D are schematic cross-section diagrams showing, in order, a portion of manufacturing processes of a light-emitting device 100 according to Embodiment 1.

Process by which an Aspect of the Present Invention was Achieved

When adopting a charge injection layer formed from a conventional metal compound, the inventors discovered the problem of the surface of the charge injection layer being corroded by the liquid used in the wet process for forming the banks. The inventors determined that when part of the charge injection layer was corroded, the film thickness of the charge injection layer may change depending on the degree of corrosion, resulting in uneven light-emitting characteristics.

The inventors also discovered that, between forming the charge injection layer and laminating the light-emitting layer, performing steps such as forming the banks led to the problem of impurities adhering to the surface of the charge injection layer. The inventors determined that laminating the light-emitting layer on a charge injection layer to which impurities have thus adhered leads to a reduction in the light-emitting characteristics of the organic EL element. Therefore, after intense study to solve the above problems, the inventors created the present invention with the object of providing a method for manufacturing light-emitting elements, light-emitting elements, a method for manufacturing light-emitting devices, and light-emitting devices, the elements and devices including a layer having a metal compound below the light-emitting layer while having strong light-emitting characteristics and reducing corrosion and adhesion of impurities caused by forming the banks.

The following steps are performed in a method of manufacturing a light-emitting element according to an aspect of the present invention.

(First step) Forming a first electrode on one main surface of a substrate.

(Second step) Forming a layer including a metal compound above at least the first electrode.

(Third step) Covering at least the layer including the metal compound with a protective film.

(Fourth step) Forming banks by a wet process on the protective film, the banks defining an aperture through which a portion of the protective film is exposed.

(Fifth step) Removing the portion of the protective film exposed through the aperture so that a portion of the layer including the metal compound is exposed.

(Sixth step) Forming a light-emitting layer on the layer including the metal compound exposed through the aperture by performing the fifth step.

(Seventh step) Forming a second electrode of differing polarity than the first electrode above the light-emitting layer.

In the method of manufacturing a light-emitting element according to this aspect of the present invention, the protective film is resistant to a liquid used during the wet process in the fourth step.

In the method of manufacturing a light-emitting element according to this aspect of the present invention, the banks are formed with the layer including the metal compound having been covered by the protective film. Furthermore, in the method of manufacturing a light-emitting element according to this aspect of the present invention, the protective film is resistant to the liquid used during the wet process in the fourth step. Therefore, in the method of manufacturing a light-emitting element according to this aspect of the present invention, the layer including the metal compound, the upper surface of which is covered by the protective film, is not corroded by the wet process in the fourth step.

Therefore, in the method of manufacturing a light-emitting element according to this aspect of the present invention, the thickness of the metal compound layer is guaranteed to a high degree of accuracy, and a light-emitting element having strong light-emitting characteristics is manufactured.

Moreover, in the method of manufacturing a light-emitting element according to this aspect of the present invention, as described above, while the wet process in the fourth step is being pertained, the upper surface of the layer including the metal compound is covered by the protective film, and after completion of the wet process in the fourth step, a portion of the protective film is removed (fifth step), and the light-emitting layer is then layered thereon (sixth step). Therefore, no impurities due to formation of the banks are located between the layer including the metal compound and the light-emitting layer.

Accordingly, in the method of manufacturing a light-emitting element according to this aspect of the present invention, no impurities are located between the layer including the metal compound and the light-emitting layer, thus allowing for the manufacture of a light-emitting element having strong light-emitting characteristics.

In summary, the method of manufacturing a light-emitting element according to this aspect of the present invention allows for the manufacture of a light-emitting element having strong light-emitting characteristics.

In the method of manufacturing a light-emitting element according to this aspect of the present invention, the protective film may be more resistant than the layer including the metal compound to corrosion by the liquid used during the wet process in the fourth step, the fifth step may include removal by etching of the portion of the protective film exposed through the aperture, and the layer including the metal compound may be more resistant than the protective film to corrosion by a liquid used during the etching of the protective film in the fifth step.

When adopting the above structure, the layer including the metal compound is more resistant than the protective film to corrosion by a liquid used during the etching of the protective film in the fifth step. Therefore, corrosion of the layer including the metal compound is more reliably prevented when the wet process in the fourth step is performed.

In the method of manufacturing a light-emitting element according to this aspect of the present invention, the protective film and the layer including the metal compound may have different etching rates with respect to a same treatment liquid.

When adopting the above structure, the protective film and the layer including the metal compound have different etching rates with respect to the same treatment liquid, and corrosion of the layer including the metal compound is therefore more reliably prevented.

In the method of manufacturing a light-emitting element according to this aspect of the present invention, the protective film may have a lower etching rate than the layer including the metal compound with respect to the liquid used during the wet process in the fourth step, the fifth step may include removal by etching of the portion of the protective film exposed through the aperture, and the layer including the metal compound may have a lower etching rate than the protective film with respect to a liquid used during the etching of the protective film in the fifth step.

When adopting the above structure, the layer including the metal compound has a lower etching rate than the protective film with respect to the liquid used during the etching of the protective film in the fifth step. Therefore, when removing the protective film in the fifth step, the layer including the metal compound is more reliably protected.

In the method of manufacturing a light-emitting element according to this aspect of the present invention, the fifth step may include removal by etching of the portion of the protective film exposed through the aperture, the protective film need not be corroded by the liquid used during the wet process in the fourth step and may be corroded by a liquid used during the etching of the protective film in the fifth step, and the layer including the metal compound need not be corroded by the liquid used during the etching of the protective film in the fifth step.

When adopting the above structure, the layer including the metal compound is reliably protected by the protective film during performance of the wet process in the fourth step, and the portion of the protective film exposed through the aperture is removed during the fifth step while the layer including the metal compound is reliably protected. Therefore, by performing the sixth step, the light-emitting layer is layered on the layer including the metal compound, thus allowing for the manufacture of a light-emitting element having strong light-emitting characteristics.

In the method of manufacturing a light-emitting element according to this aspect of the present invention, the wet process in the fourth step may include developing to faun the banks and a cleaning after the developing, and the fifth step may include a cleaning after the etching. Furthermore, the protective film need not be corroded by liquids used during the developing and the cleaning in the fourth step and may be corroded by the liquid used during the etching of the protective film in the fifth step, and the layer including the metal compound need not be corroded by the liquid used during the etching of the protective film in the fifth step and may be corroded by a liquid used during the cleaning in the fifth step.

When adopting the above structure, the protective film is not corroded by liquids used during the developing and the cleaning in the fourth step, thus more reliably protecting the layer including the metal compound during performance of the fourth step. Furthermore, the protective film is corroded by the liquid used during the etching of the protective film in the fifth step, thus reliably removing the portion of the protective film exposed through the aperture by performing the etching in the fifth step.

Furthermore, the layer including the metal compound is not corroded by the liquid used during the etching of the protective film in the fifth step and is corroded by the liquid used during the cleaning in the fifth step. Therefore, no impurities are located between the light-emitting layer layered in the sixth step and the layer including the metal compound. Accordingly, when adopting the above structure, adhesion of impurities and corrosion caused by formation of the banks (fourth step) are reduced while providing the layer including the metal compound below the light-emitting layer, thus allowing for the manufacture of a light-emitting element having strong light-emitting characteristics.

In the method of manufacturing a light-emitting element according to this aspect of the present invention, in the fifth step, the layer including the metal compound may be corroded by the liquid used in the cleaning in order to expose an inner surface thereof, and in the sixth step, the light-emitting layer may be formed on the exposed inner surface of the layer including the metal compound.

With this structure, in the fifth step, the layer including the metal compound is corroded by the liquid used in the cleaning, thus exposing an inner surface thereof, on which the light-emitting layer is formed. This allows for the manufacture of a light-emitting element having strong light-emitting characteristics.

In the method of manufacturing a light-emitting element according to this aspect of the present invention, in the fifth step, in addition to the portion of the protective film exposed through the aperture, the portion of the layer including the metal compound may also be removed in order to expose a portion of an inner surface of the layer including the metal compound, and in the sixth step, the light-emitting layer may be formed on the exposed portion of the inner surface of the layer including the metal compound.

When adopting this structure, a strong ability to retain ink is maintained when forming the light-emitting layer in the sixth step. In other words, since the exposed portion of the inner surface of the layer including the metal compound has a strong ability to retain ink, a strong ability to retain ink is maintained when layering the light-emitting layer, thus allowing for the manufacture of a light-emitting element having strong light-emitting characteristics.

In the method of manufacturing a light-emitting element according to this aspect of the present invention, in the fifth step, the portion of the protective film exposed through the aperture may be removed, and portions of the protective film corresponding to the banks may be left without being removed.

When adopting this structure, the light-emitting layer is layered on the layer including the metal compound since the portion of the protective film exposed through the aperture is removed, thus achieving excellent charge-injection properties.

Furthermore, the portions of the protective film covered by the banks remains, without being removed, thus preserving strong adhesive properties between the banks and the layer including the metal compound.

In the method of manufacturing a light-emitting element according to this aspect of the present invention, the protective film may be formed from an insulating material.

In the method of manufacturing a light-emitting element according to this aspect of the present invention, the protective film may be formed from an inorganic material.

In the method of manufacturing a light-emitting element according to this aspect of the present invention, the protective film may be formed from an $SiO_2$.

In the method of manufacturing a light-emitting element according to this aspect of the present invention, the layer including the metal compound may specifically be a charge injection layer. In the fifth step, the charge injection layer may be exposed by removing the portion of the protective film exposed through the aperture, and in the sixth step, the light-emitting layer may be layered on the charge injection layer.

When adopting this structure, the light-emitting layer is laminated on the layer including the metal compound (the charge injection layer) since the portion of the protective film exposed through the aperture is removed, thus achieving excellent charge-injection properties.

In the method of manufacturing a light-emitting element according to this aspect of the present invention, the layer including the metal compound may have a laminated structure in which a charge injection layer and a charge transport layer both formed from a metal oxide are layered in this order, the charge injection layer being closer to the first electrode, and in the fifth step, the light-emitting layer may be layered on the charge transport layer.

When adopting this structure, the layer including the metal compound has a laminated structure including the charge injection layer and the charge transport layer, so that the charge transport layer is located between the charge injection layer and the light-emitting layer. This structure yields excellent charge-injection properties, thus allowing for the manufacture of a light-emitting element having strong light-emitting characteristics.

Note that when the above "the first electrode" is a cathode, the "layer including the metal compound" becomes "an electron injection layer, an electron transport layer, or an electron injection/transport layer".

In the method of manufacturing a light-emitting element according to this aspect of the present invention, in the second step, the layer including the metal compound may be formed from one of a metal oxide, a metal nitride, and a metal nitride oxide.

In the method of manufacturing a light-emitting element according to this aspect of the present invention, in the sixth step, the light-emitting layer may be formed form an organic coating material.

In the method of manufacturing a light-emitting element according to this aspect of the present invention, in the sixth step, the light-emitting layer may be formed by an inkjet method.

A method of manufacturing a light-emitting device according to another aspect of the present invention comprises forming each of a plurality of subpixels with the above method of manufacturing a light-emitting element according to the above aspect of the present invention. This structure allows for the manufacture of a light-emitting device having strong light-emitting characteristics, as described above. Note that a "light-emitting device" according to this aspect of the present invention refers, for example, to a lighting device, a display device, or the like.

A light-emitting element according to another aspect of the present invention comprises, on one main surface of a substrate, a first electrode, a second electrode, a light-emitting layer, a layer including a metal compound, and banks defining at least the light-emitting layer, the light-emitting layer and the layer including the metal compound being between the first electrode and the second electrode. The layer including the metal compound is located at least above the first electrode, a protective film is located between the layer including the metal compound and a bottom surface of the banks, and the protective film has an aperture in a region corresponding to an aperture defined by the banks and is resistant to corrosion by a liquid used during a wet process to form the banks layered thereabove.

By being provided with the above features, the light-emitting element according to this aspect of the present invention the thickness of the metal compound layer is highly accurate, and impurities are prevented from existing between the metal compound layer and the light-emitting layer, thus achieving strong light-emitting characteristics.

In the above structure, the layer including the metal compound may be extended along the bottom surface of the banks in the direction of adjacent subpixels. "Along the bottom surface of the banks" refers not only to extending along the entire bottom surface of the banks, but also along only a portion of the bottom surface of the banks.

In the light-emitting element according to this aspect of the present invention, the layer including the metal compound may have a concavity in a central region thereof corresponding to the aperture defined by the banks, such that the central region is recessed towards the one main surface of the substrate as compared to edges of the layer including the metal compound. When adopting this structure, the concavity is formed as a bottom portion of the layer including the metal compound. This structure is superior in terms of ability to retain ink. As compared to a conventional structure with a lower ability to retain ink, this structure has high light-emitting characteristics.

In the light-emitting element according to this aspect of the present invention, the protective film may be a film for increasing adhesive properties between the layer including the metal compound and a bottom surface of the banks. This structure achieves strong adhesive properties between the layer including the metal compound and the bottom surface of the banks, thus achieving high quality.

In the light-emitting element according to this aspect of the present invention, the protective film may be made of an insulating material.

In the light-emitting element according to this aspect of the present invention, the protective film may be made of an inorganic material.

In the light-emitting element according to this aspect of the present invention, the protective film may be made of $SiO_2$.

In the light-emitting element according to this aspect of the present invention, the layer including the metal compound may be a charge injection layer, and the light-emitting layer may be located on the charge injection layer at the aperture of the protective film. When adopting this structure, the light-emitting layer is located on the layer including the metal compound (the charge injection layer) at the portion corresponding to the aperture of the protective film, thus achieving excellent charge-injection properties.

In the light-emitting element according to this aspect of the present invention, the layer including the metal compound may have a laminated structure in which a charge injection layer and a charge transport layer both made of a metal oxide are layered in this order, the charge injection layer being closer to the first electrode, and the light-emitting layer may be located on the charge transport layer at the aperture of the protective film. When adopting this structure, the layer including the metal compound has a laminated structure including the charge injection layer and the charge transport layer, so that the charge transport layer is located between the charge injection layer and the light-emitting layer. This structure has excellent charge-injection properties and strong light-emitting characteristics.

In the light-emitting element according to this aspect of the present invention, the layer including the metal compound is more lyophilic than a surface of the banks. When adopting this structure, a strong ability to retain ink is maintained when forming the light-emitting layer.

In the light-emitting element according to this aspect of the present invention, the light-emitting layer may be made of an organic coating material.

A light-emitting element according to another aspect of the present invention comprises, on one main surface of a substrate, a first electrode and a second electrode, a light-emitting layer and a layer including a metal compound between the first electrode and the second electrode, and banks defining at least the light-emitting layer. In the light-emitting element according to this aspect of the present invention, the layer including the metal compound may be located at least above the first electrode and include an inner bottom surface and inner side walls contiguous with the inner bottom surface, and an interlayer film may be located between the layer including the metal compound and a bottom surface of the banks. The interlayer film may have an aperture in a region corresponding to an aperture defined by the banks. In the light-emitting element according to this aspect of the present invention, the light-emitting layer is in contact, at a bottom side thereof, with the inner bottom surface and the inner side walls of a concavity in the layer including the metal compound.

In a light-emitting element adopting this structure, the interlayer film is located between the layer including the metal compound and the bottom surface of the banks, thus improving adhesive properties between the layer including the metal compound and the bottom surface of the banks. Note that the interlayer film corresponds to the protective film in the other aspects.

When the interlayer film is composed of $SiO_2$, for example, the interlayer film has repellency, which may be thought to affect formation of the light-emitting layer. However, since the layer including the metal compound has a concavity, the light-emitting layer is in contact with not only the bottom surface of the concavity, but also with the side walls thereof. Therefore, in the light-emitting element according to this aspect of the present invention, a bottom side of the light-emitting layer is formed and retained in the concavity of the layer including the metal compound, thus achieving an excellent light-emitting layer. This structure yields strong light-emitting characteristics.

In the light-emitting element according to this aspect of the present invention, the interlayer film may be made of an insulating material.

In the light-emitting element according to this aspect of the present invention, the interlayer film may be made of an inorganic material.

In the light-emitting element according to this aspect of the present invention, the interlayer film may be made of $SiO_2$.

A light-emitting device according to another aspect of the present invention comprises a plurality of subpixels, each of which includes the light-emitting element according to the above aspect of the present invention. With this structure, the light-emitting device according to this aspect of the present invention has high light-emitting characteristics for the above-described reasons.

The following describes embodiments of the present invention with reference to examples.

Note that the embodiments in the following description are only examples for clearly illustrating the structure, operations, and advantageous effects of the present invention. The present invention is not limited in any way to the following embodiments other than in its essential characteristics.

[Embodiment 1]

1. Method of Manufacturing Light-Emitting Device 100

The following describes the main parts of the method of manufacturing a light-emitting device 100 according to Embodiment 1 with reference to FIGS. 1A through 3D. Note that FIGS. 1A through 3D show only a cut-out portion of the light-emitting device 100.

As shown in FIG. 1A, anodes 2 are first formed on one surface of a substrate 1 (the upper surface in the direction of the Z axis). The substrate 1 is in fact a TFT substrate (circuitry and the like are omitted from the figures) formed as a base of an insulating material or the like such as soda glass, nonfluorescent glass, phosphate glass, borate glass, quartz, acrylic resin, styrenic resin, polycarbonate resin, epoxy resin, polyethylene, polyester, silicone resin, alumina, etc.

The anodes 2 are formed from Ag (silver). Note that in addition to Ag, the anodes 2 may be formed from APC (alloy of silver, palladium, and copper), ARA (alloy of silver, rubidium, and gold), MoCr (alloy of molybdenum and chromium), NiCr (alloy of nickel and chromium), or the like.

Figure 1B:
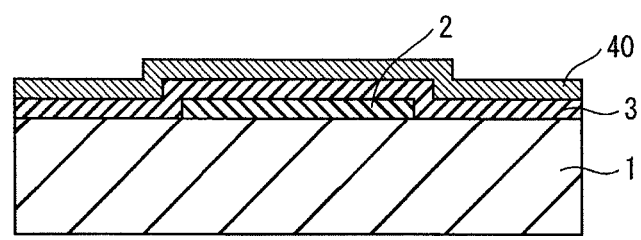

Next, as shown in FIG. 1B, the upper surface of the substrate 1 on which the anodes 2 have been formed, as well as the upper surface of the anodes 2, are covered by a hole-injection layer 3, which is further covered by a protective film (interlayer film) 40. The hole-injection layer 3 is formed from a metal compound such as $WO_x$ (tungsten oxide) or $MoWO_x$ (molybdenum tungsten oxide). In addition to the above metal oxides, the metal compound used to form the hole-injection layer 3 may be a metal nitride or a metal nitride oxide, for example.

When the hole-injection layer 3 is formed from a specific metal compound, holes are easily injected. Electrons in the light-emitting layer thus effectively contribute to light emission, yielding excellent light-emitting characteristics. It is preferable that the specific metal compound include a transition metal. Transition metals have a plurality of oxidation numbers, and thus a plurality of priority levels. As a result, hole injection becomes easy, thus reducing driving voltage.

The protective film 40 is formed from $SiO_2$ (silicon oxide). Note that in addition to $SiO_2$, the protective film 40 may be formed from an inorganic material such as an oxide or a nitride of chromium or titanium, a metallic material, or the like.

Figure 1C:
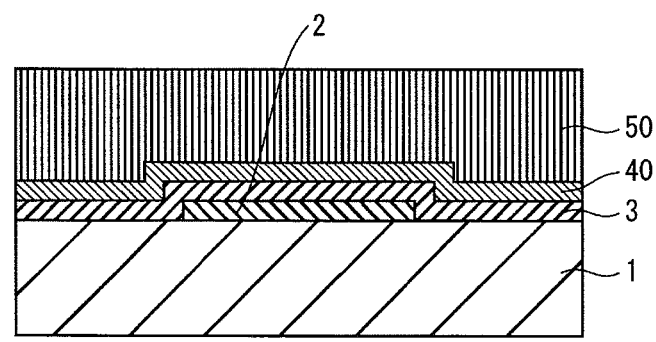

Next, as shown in FIG. 1C, a bank preparation film 50 is formed by deposition to cover the protective film 40. The material for forming the bank preparation film 50 may, for example, be an insulating organic material such as polyimide. Specifically, the bank preparation film 50 is formed, for example, by a method such as spin coating, spray coating, roll coating, die coating, dip coating, or the like.

Figure 1D:
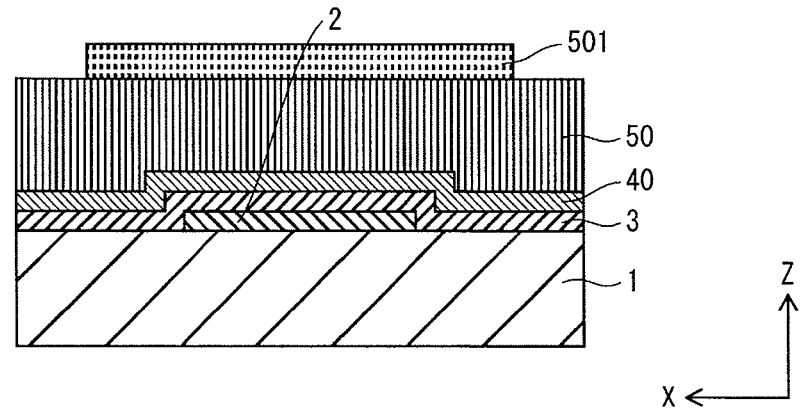

Then, as shown in FIG. 1D, a mask 501 is formed on portions of the bank preparation film 50 (at locations in which apertures are to be provided), and the light-emitting device is exposed in this condition.

Figure 2A:
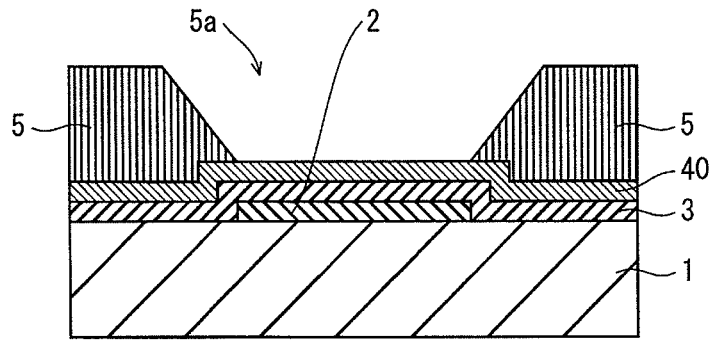
FIGS. 2A-2C are schematic cross-section diagrams showing, in order, a portion of manufacturing processes of the light-emitting device 100 according to Embodiment 1.

Next, the exposed bank preparation film 50 is developed, and as shown in FIG. 2A, banks 5 are formed so as to enclose apertures 5a in locations corresponding to subpixels. The banks 5 are formed as separators to define a light-emitting layer 6 (see FIG. 3A) in a subpixel.

Figure 2B:
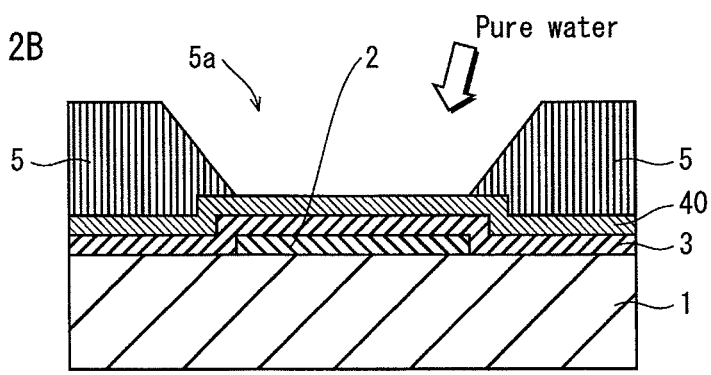

After forming the banks 5 enclosing the apertures 5a, unnecessary developing liquid remaining after development is then removed using a cleaning liquid such as pure water (see FIG. 2B). The banks 5 are thus formed by a wet process.

When forming the banks 5, it is unnecessary to provide a separate resist if the bank formation material itself is photosensitive. Wet etching may also be unnecessary.

When forming the banks 5, at least a portion of the surface thereof may be provided with repellency so that ink used to form the light-emitting layer 6 (see FIG. 3A) does not leak into an adjacent subpixel. In addition to using a material having repellency to form the banks 5, it is also possible, as a method of providing repellency, to cause a fluorine component to be exposed on the surface of the banks 5 via plasma treatment (i.e. turning the surface into Teflon (registered trademark)).

In addition to polyimide, the banks 5 may be formed from an organic material such as acrylic resin, novolac-type phenolic resin, or the like.

Dry etching may be used to form the banks 5. In this case as well, the protective film 40 is useful for preventing impurities from adhering to the surface of the hole-injection layer 3 located below the protective film 40.

Figure 2C:
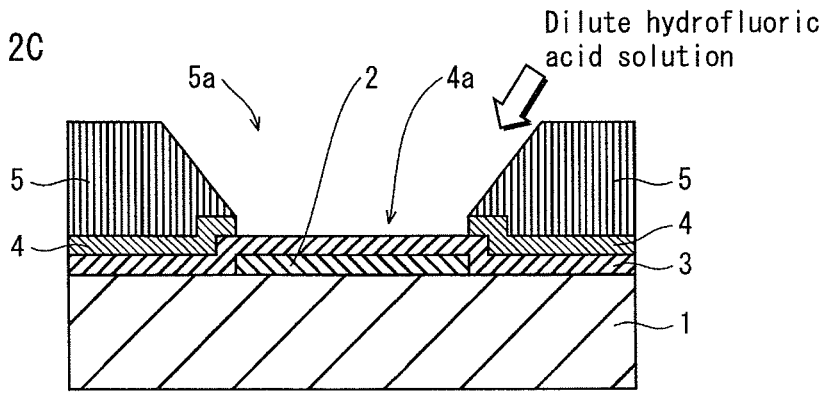

As shown in FIG. 2C, the portion of the protective film 40 at the lower portion of each aperture 5a in the banks 5 is then removed. In this condition, the protective film 4 is layered between the lower portion of the banks 5 and the hole-injection layer 3, and the hole-injection layer 3 is exposed through the aperture 4a. Note that removal of $SiO_2$ can be performed by etching with a dilute hydrofluoric acid solution.

When the protective film 4 is formed from $SiO_2$ to a thickness of approximately 50 nm, it was confirmed that the protective film 4 can be removed and repellency of the banks 5 maintained by etching for approximately two minutes using a dilute hydrofluoric acid solution having a concentration of 0.5%.

When the pH of the dilute hydrofluoric acid solution used for etching is less than neutral, an additive may be included.

During the above etching, the hole-injection layer 3 is not dissolved by the dilute hydrofluoric acid solution, since the dilute hydrofluoric acid solution is acidic.

Figure 3A:
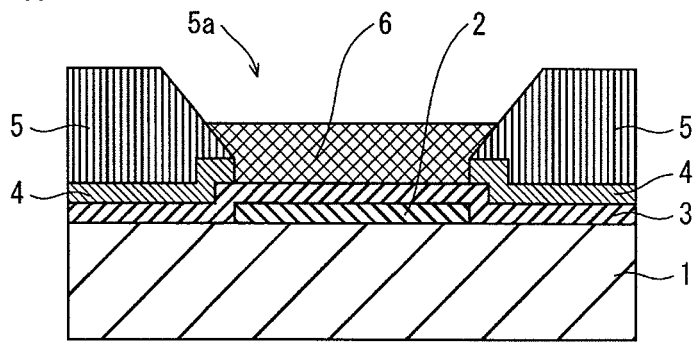
FIGS. 3A-3D are schematic cross-section diagrams showing, in order, a portion of manufacturing processes of the light-emitting device 100 according to Embodiment 1.

As shown in FIG. 3A, the light-emitting layer 6 is then formed in a concavity defined by the banks 5. The light-emitting layer 6 is thus layered on the hole-injection layer 3. The light-emitting layer 6 is formed by, for example, dripping ink including material for the light-emitting layer 6 into the concavity defined by the banks 5 using the inkjet method and then drying the ink. Note that in addition to the inkjet method, the ink for forming the light-emitting layer 6 may be dripped using a dispenser method, nozzle coating, spin coating, intaglio printing, letterpress printing, or the like.

The materials disclosed in Japanese Patent Application Publication No. H5-163488, for example, may be used as the materials for forming the light-emitting layer 6. Specifically, the material may be a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2,2'-bipyridine compound, complex of a Schiff base and a group three metal, metal complex of oxine, rare earth metal complex, or the like.

Figure 3B:
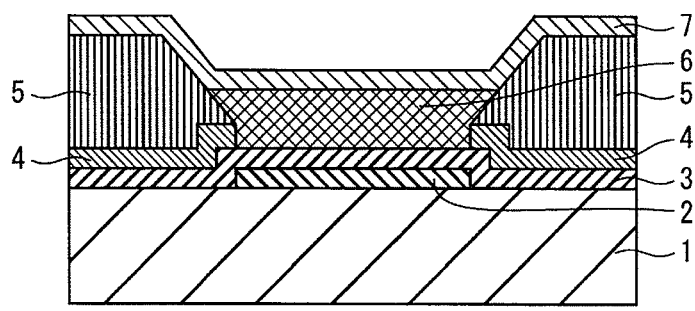

Next, as shown in FIG. 3B, an electron injection layer 7 is formed to cover the surface of the light-emitting layer 6 and the banks 5. The electron injection layer 7 may, for example, be formed from barium, phthalocyanine, lithium fluoride, or a combination thereof.

Figure 3C:
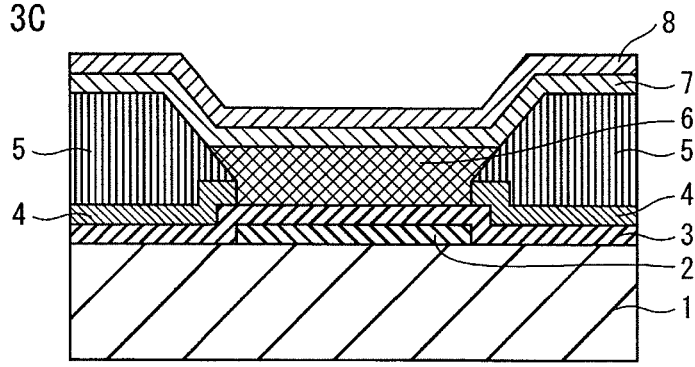

As shown in FIG. 3C, a cathode 8 is then formed on the upper surface of the electron injection layer 7. The cathode 8 may, for example, be formed from indium tin oxide (ITO), indium zinc oxide (IZO), or the like.

Figure 3D:
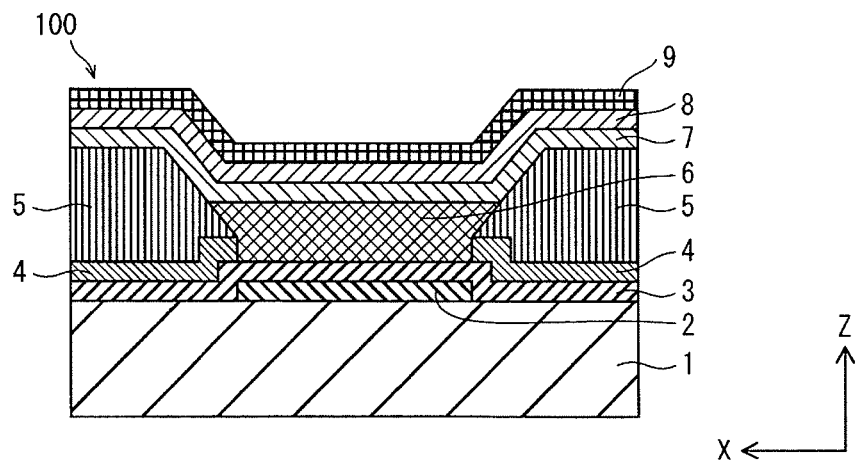

Next, as shown in FIG. 3D, the cathode 8 is covered with a passivation layer 9. The passivation layer 9 has the function of reducing the penetration of water into the light-emitting layer 6 and may, for example, be formed from silicon nitride (SiN), silicon oxynitride (SiON), or the like.

Note that while omitted from the figures, a color filter, a transparent substrate, and the like are laminated above the passivation layer 9.

Formation of the light-emitting device 100 is thus complete.

2. Advantageous Effects

The method of manufacturing the light-emitting device 100 according to Embodiment 1 has the following advantageous effects.

As shown in FIGS. 1A through 3D, the method of manufacturing the light-emitting device 100 according to Embodiment 1 uses a metal compound to form the hole-injection layer 3. Therefore, as compared to conventional formation of the hole-injection layer using PEDOT, the light-emitting device 100 manufactured with the method of manufacturing according to Embodiment 1 has the advantages of excellent voltage-current density characteristics in each subpixel and of not deteriorating easily even when a high current flows to achieve intense light emission.

Furthermore, in the method of manufacturing according to Embodiment 1, the banks 5 are formed after the hole-injection layer 3 formed from the metal compound has been covered by the protective film 40. The protective film 40 is formed from an inorganic material such as $SiO_2$, as described above, and is resistant to the liquid used in the wet process when forming the banks 5. The protective film 40 is resistant to the liquid used in the wet process when forming the banks 5. The protective film 40 may be provided with higher resistance to corrosion by the liquid used in the wet process when forming the banks 5 than the hole-injection layer 3 formed from the metal compound. Accordingly, in the method of manufacturing according to Embodiment 1, the hole-injection layer 3 covered by the protective film 40 does not corrode due to the wet process for forming the banks 5.

The above "resistance" is a physical property indicating the degree to which the film is not corroded by a treatment solution. Specifically, the resistance is expressed as the corrosion resistance and the etching rate with respect to the treatment solution. For example, the resistance is expressed as follows.

1) Wet Process During Bank Formation Step
1-1) Development
Developing liquid: Tetra Methyl Ammonium Hydroxide (TMAH): 0.1%-2.5% (for example, 0.4%)
Protective film ($SiO_2$): etching rate=approximately 0 nm/min (nearly no dissolution)
Hole-injection layer ($WO_x$): etching rate=8 nm/min (dissolution)
Etching rate: protective film ($SiO_2$)<hole-injection layer ($WO_x$)
1-2) Washing Treatment (Washing Solution; Pure (Neutral))
Protective film ($SiO_2$): etching rate=0 nm/min (absolutely no dissolution)
Hole-injection layer ($WO_x$): etching rate=1 nm/min (slight dissolution)
Etching rate: protective film ($SiO_2$)<hole-injection layer ($WO_x$)
2) Step to Remove Protective Film
2-1) Etching
Etchant: dilute hydrofluoric acid solution (acidic)
Protective film ($SiO_2$): etching rate=109 nm/min (dissolution)
Hole-injection layer ($WO_x$): etching rate=0 nm/min (no dissolution)
Etching rate: protective film ($SiO_2$)>hole-injection layer ($WO_x$)
2-2) Washing Treatment
Washing solution: pure (neutral)
Protective film ($SiO_2$): etching rate=0 nm/min (absolutely no dissolution)
Hole-injection layer ($WO_x$): etching rate=1 nm/min (slight dissolution)
Etching rate: protective film ($SiO_2$)<hole-injection layer ($WO_x$)

Accordingly, in the method of manufacturing according to Embodiment 1, the dimensional accuracy of the hole-injection layer 3 is guaranteed to a high degree of precision, thus manufacturing the light-emitting device 100 to have strong light-emitting characteristics.

Furthermore, as described above, during the method of manufacturing according to Embodiment 1, the upper surface of the hole-injection layer 3 in the direction of the Z axis is covered by the protective film 40 while the wet process for forming the banks 5 is performed. After formation of the banks 5 is complete, a portion of the protective film 40 is removed, and the light-emitting layer 6 is layered thereabove, so that no impurities caused by formation of the banks 5 are located between the hole-injection layer 3 and the light-emitting layer 6. In addition, the metal compound (such as $WO_x$, $MoWO_x$, or the like) used as the material for the hole-injection layer 3 is more lyophilic than conventionally used PEDOT or the like, whereby strong adhesion is maintained with the ink when the light-emitting layer 6 is formed.

Accordingly, with the method of manufacturing according to Embodiment 1, the light-emitting device 100 is manufactured to have strong light-emitting characteristics, since no impurities are located between the hole-injection layer 3 and the light-emitting layer 6, and since the light-emitting device 100 has strong adhesive properties.

3. Structure of Light-Emitting Device 100

Figure 4:
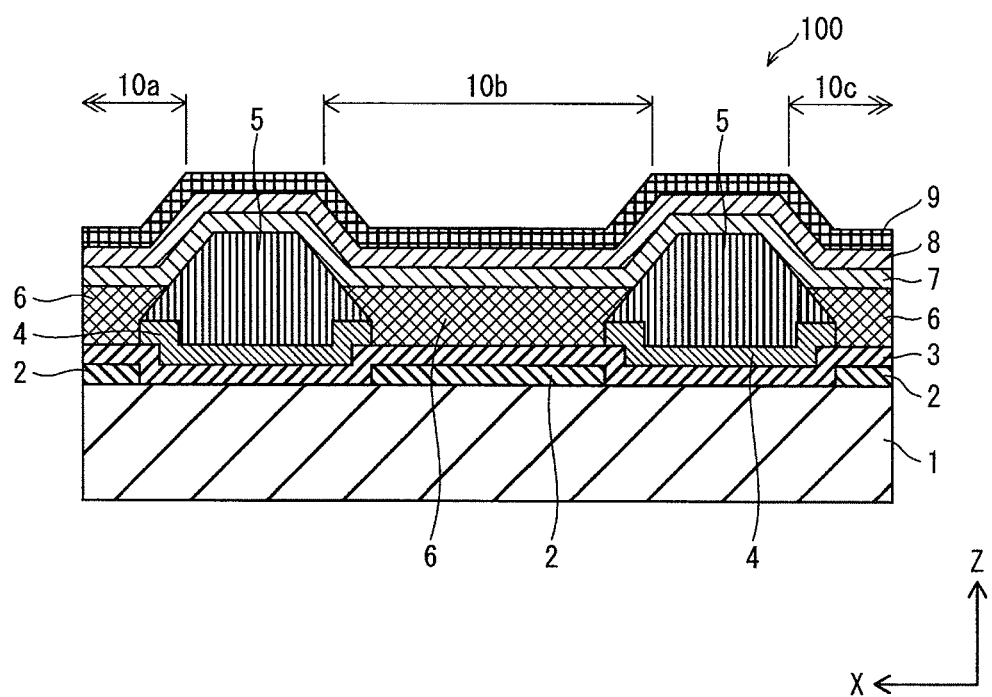
FIG. 4 is a schematic cross-section diagram showing the main structure of the light-emitting device 100.

The structure of the light-emitting device 100 according to Embodiment 1 as manufactured by the above method of manufacturing is described with reference to FIGS. 4 and 5. FIG. 4 is a schematic cross-section diagram showing a subpixel 10b in the light-emitting device 100 and a portion of two adjacent subpixels.

As shown in FIG. 4, the light-emitting device 100 is formed with the substrate 1 as a base. A plurality of anodes 2 are formed at a distance from each other on the upper surface, in the direction of the Z axis, of the substrate 1. Note that while FIG. 4 shows a plurality of anodes 2 provided at a distance from each other in the direction of the X axis, a plurality of anodes 2 are also provided at a distance from each other in a direction perpendicular to the page.

The hole-injection layer 3 is formed to cover the upper surface of the substrate 1 and the anodes 2. The banks 5 are formed above the hole-injection layer 3, with the protective film 4 therebetween, at locations corresponding to areas between anodes 2. The banks 5 are for defining the light-emitting layer 6 in each of the subpixels 10a-10c, and a cross-sectional shape of the banks 5 is a trapezoid. The lateral cross-sectional area of the trapezoid decreases as height in the Z direction increases.

Figure 5:
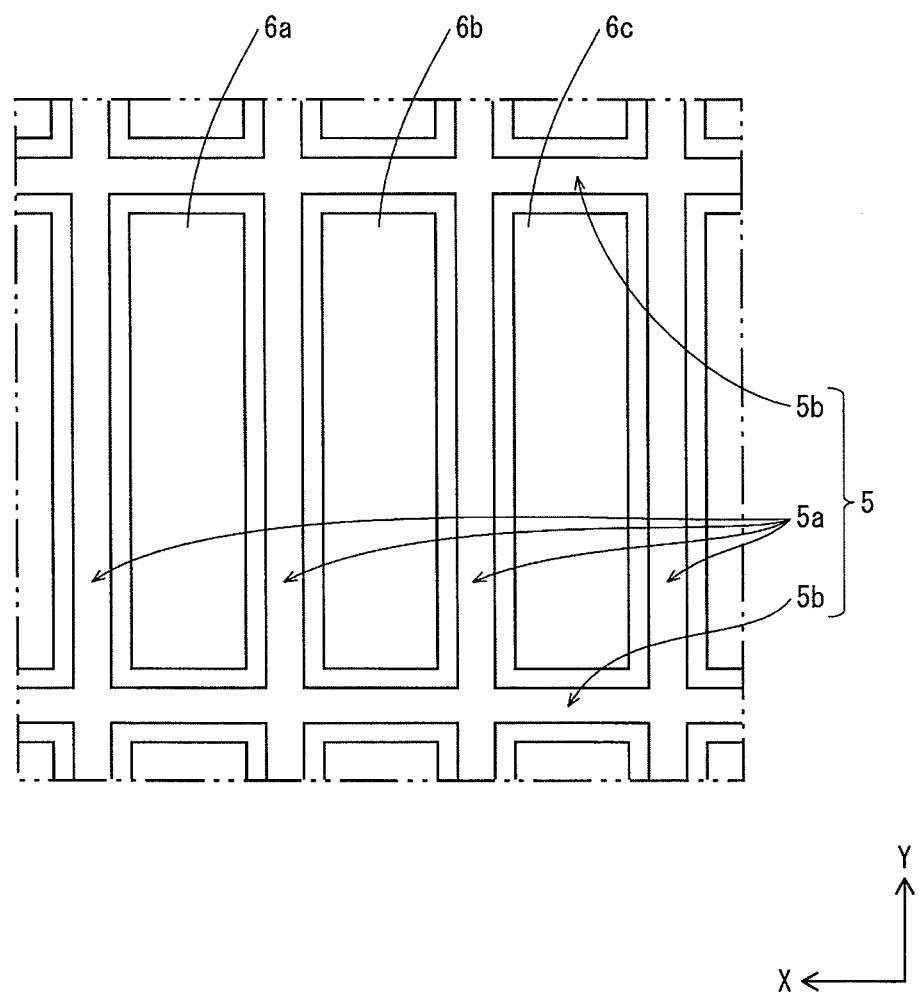
FIG. 5 is a schematic plan view of the shape of banks 5 in the light-emitting device 100.

As shown in FIG. 5, the banks 5 in Embodiment 1 are grid-shaped pixel banks. Bank elements 5a extending along the Y axis partition light-emitting layers 6a, 6b, and 6c in subpixels that are adjacent along the X axis.

On the other hand, bank elements 5b extending along the X axis partition light-emitting layers of subpixels that are adjacent along the Y axis.

Note that as shown in FIG. 5, three subpixels that are adjacent along the X axis respectively correspond to the colors red (R), green (G), and blue (B). As a set, these three adjacent subpixels constitute one pixel.

Returning to FIG. 4, an electron injection layer 7, a cathode 8, and a passivation layer 9 are formed along the entire surface. Note that, while omitted from FIG. 4, above the passivation layer 9 in the light-emitting device 100, color filters may further be provided in correspondence with the subpixels 10a-10c, and a transparent substrate may further be provided.

Since the light-emitting device 100 is manufactured with the above method, the light-emitting device 100 naturally has the above advantages.

The hole-injection layer 3 is formed from a metal compound. The banks 5 and the metal compound of the hole-injection layer 3 do not directly have sufficient adhesive properties. However, in the light-emitting device 100 according to Embodiment 1, the protective film 4 composed of $SiO_2$ or the like is located between the hole-injection layer 3 and the banks 5, thus supplementing the adhesive properties between the hole-injection layer 3 and the banks 5.

As a result, the light-emitting device 100 also has strong light-emitting characteristics due to the above structure.

4. Detailed Structure of Hole-Injection Layer 3 in Light-Emitting Device 100

Figure 6:
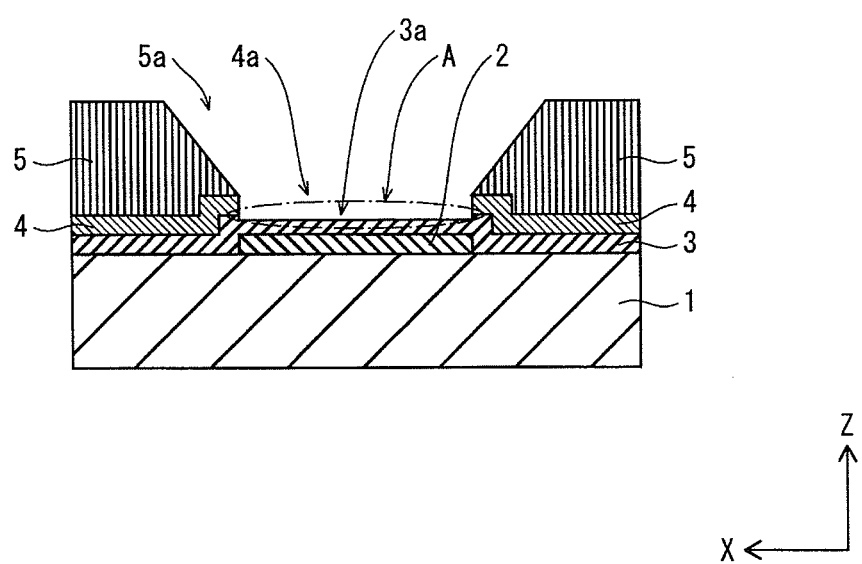
FIG. 6 is a schematic cross-section diagram showing a detailed structure of the light-emitting device 100 during manufacturing.

The detailed structure of the hole-injection layer 3 in the light-emitting device 100 is described with reference to FIG. 6. FIG. 6 shows details on the condition shown in FIG. 2C.

As shown in FIG. 6, after completion of formation of the banks 5, the $SiO_2$ at the bottom of the aperture 5a is removed, so that the hole-injection layer 3 is exposed through an aperture 4a in the protective film 4. In this condition, a shallow concavity 3a (indicated by the arrow A) is formed in the hole-injection layer 3 exposed through the aperture 4a in the protective film 4.

The concavity 3a forms during the process of removing the $SiO_2$ when, after etching with the dilute hydrofluoric acid solution, the etching solution and the like are washed off with pure water. As described above, while the $WO_x$ forming the hole-injection layer 3 dissolves in pure water, the etching rate during the washing treatment with pure water is smaller than the etching rate during the etching via the wet process, as stated above. Therefore, the concavity 3a is far more shallow than the concavity formed by the wet process when forming the banks.

Although the shallow concavity 3a thus forms in the hole-injection layer 3 when using the method of manufacturing the light-emitting device 100 according to Embodiment 1, this concavity 3a is advantageous for more strongly adhering ink, which is dripped when forming the light-emitting layer 6, to the surface of the hole-injection layer 3. In other words, the hole-injection layer 3 formed from the metal compound as described above is more lyophilic than a hole-injection layer formed from PEDOT according to conventional technology and thus firmly retains ink that is dripped thereon. As a result, the hole-injection layer 3 in which the bowl-shaped concavity 3a is formed has a better capability of retaining ink than a merely flat surface, since ink also adheres to side walls surrounding the concavity 3a.

Note that in the above description, the average depth of the shallow concavity 3a in the hole-injection layer 3 is not particularly specified, but the average depth may, for example, be in a range of 5 nm to 100 nm. By ensuring that the average depth of the concavity 3a is at least 5 nm, a sufficient amount of ink can be accumulated in the concavity 3a, so that ink is stably accumulated in the region defined by the banks 5. Furthermore, formation of the light-emitting layer 6 without interruption to the edges of the banks 5 prevents a short circuit between the anode 2 and the cathode 8.

In summary, the light-emitting device 100 has strong adhesive properties between the hole-injection layer 3 and the light-emitting layer 6 and has strong light-emitting characteristics.

Next, the adhesive properties between the hole-injection layer 3 and the bottom surface of the banks 5 is described with reference to FIGS. 7A and 7B. FIG. 7A is a schematic cross-section diagram showing an enlargement of the bottom surface of the bank 5 in Embodiment 1, and FIG. 7B is a schematic cross-section diagram showing, as a comparative example, a structure in which the bottom surface of a bank 95 and a hole-injection layer 93 are directly attached.

As shown in FIG. 7A, in Embodiment 1, the bottom surface of the bank 5 is attached to the hole-injection layer 3 formed on the main upper surface of the substrate 1, with the protective film 4 layered therebetween. In Embodiment 1, $WO_x$ is used as an example of the material for the hole-injection layer 3, and an insulating organic material as described above is used to form the banks 5. Since the protective film 4 made of $SiO_2$ is layered therebetween (section B), the hole-injection layer 3 and the banks 5 have strong mutual adhesive properties. Therefore, when the temperature falls during the process of baking the banks, bubbles do not easily form between the banks 95 and the hole-injection layer 93.

By contrast, as shown in FIG. 7B, in the structure shown by the comparative example, the hole-injection layer 93 formed on the main upper surface of the substrate 91 is directly attached to the bottom surface of the bank 95 (section C). When the same structural materials as described above are used in the hole-injection layer 93 and the banks 95, the problem of mutual adhesive properties remains unresolved. Specifically, the banks 95 formed from an insulating organic material and the hole-injection layer 93 formed from $WO_x$ are less adhesive than the structure of Embodiment 1 as shown in FIG. 7A, and when the temperature rises and/or falls during the process of baking the banks, bubbles may form between the banks 95 and the hole-injection layer 93.

In summary, layering the protective film 4 between the banks 5 and the hole-injection layer 3 in the light-emitting device 100 according to Embodiment 1 guarantees strong adhesive properties between the banks 5 and the hole-injection layer 3.

[Embodiment 2]

The following describes a method of manufacturing a light-emitting device according to Embodiment 2 with reference to FIGS. 8A through 9C. Note that FIGS. 8A through 8D and 9A through 9C show processes corresponding to the processes of the method of manufacturing according to Embodiment 1 as respectively shown in FIGS. 1A through 1D and FIGS. 2A through 2C.

Figure 8A:
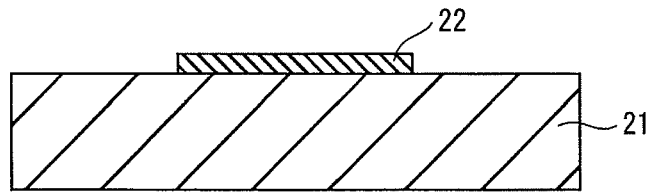
FIGS. 8A-8D are schematic cross-section diagrams showing, in order, a portion of manufacturing processes of a light-emitting device according to Embodiment 2.

As shown in FIG. 8A, anodes 22 are first formed on the upper surface in the direction of the Z axis of a substrate 21. Note that in FIG. 8A, only one anode 22 is shown, but a plurality of anodes 22 are actually formed at a distance from each other, as shown in FIG. 4. The material used to form the substrate 21 and the anodes 22 is the same as in Embodiment 1.

Figure 8B:
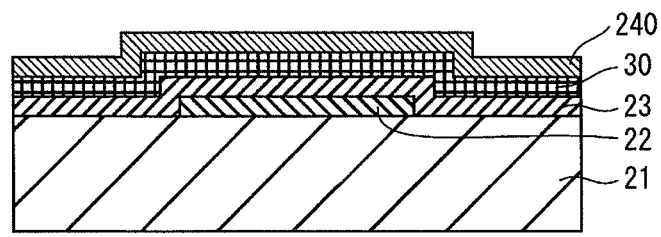

Next, as shown in FIG. 8B, during the method of manufacturing according to Embodiment 2, a hole-injection layer 23 and a hole transporting layer 30 are layered in this order so as to cover the entire upper surface of the substrate 21 and the anodes 22. A protective film 240 is then further layered thereabove. The material used to form the hole-injection layer 23 is the same as in Embodiment 1, and the same metal compound as in the hole-injection layer 3 is used to form the hole transporting layer 30. The material used to form the protective film 240 is the same as in Embodiment 1.

Figure 8C:
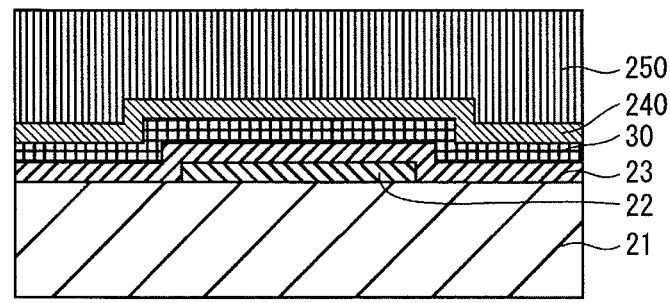

Next, as shown in FIG. 8C, a bank preparation film 250 is formed by deposition to cover the entire protective film 240. The material for forming the bank preparation film 250 may be an insulating organic material such as polyimide, as in Embodiment 1. The bank preparation film 250 is also formed as above by a method such as spin coating, spray coating, roll coating, die coating, dip coating, or the like.

Figure 8D:
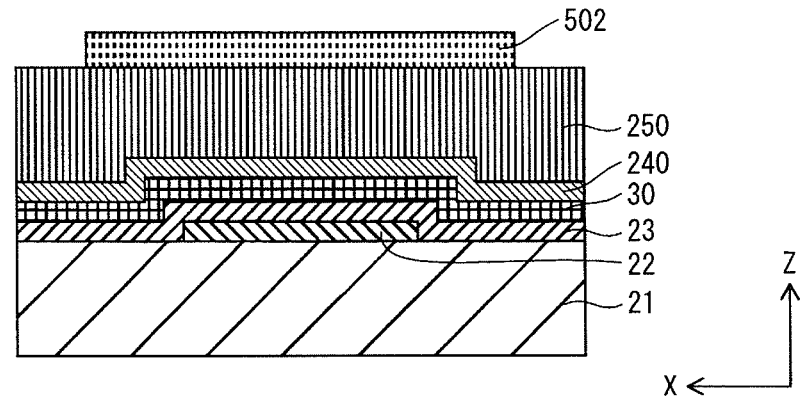

Then, as shown in FIG. 8D, a mask 502 is formed on portions of the bank preparation film 250 (at locations in which apertures are to be provided), and the light-emitting device is exposed in this condition.

Figure 9A:
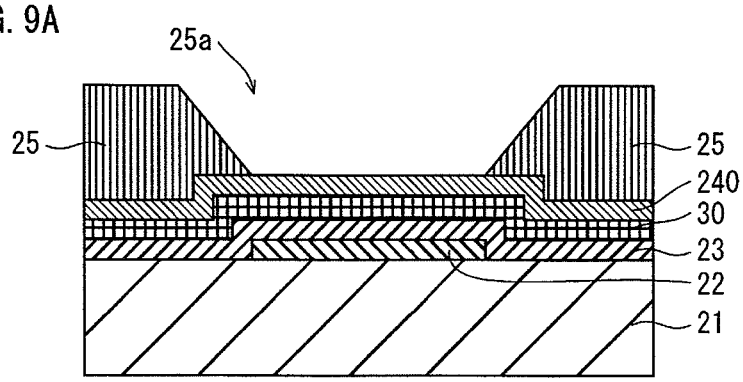
FIGS. 9A-9C are schematic cross-section diagrams showing, in order, a portion of manufacturing processes of the light-emitting device according to Embodiment 2.

Next, the exposed bank preparation film 250 is developed, and as shown in FIG. 9A, banks 25 are formed so as to enclose apertures 25a in locations corresponding to subpixels.

Figure 9B:
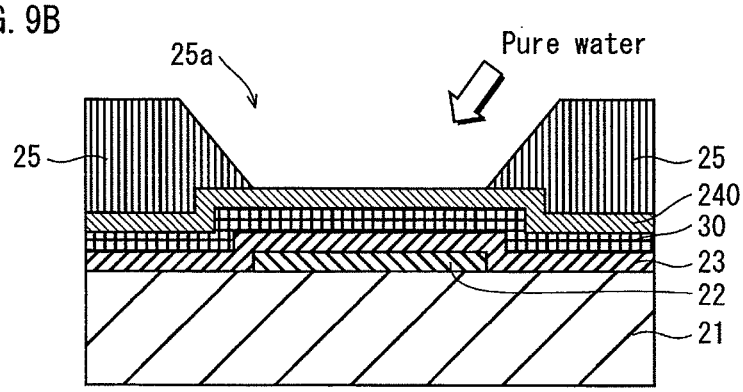

After forming the banks 25 enclosing the apertures 25a, unnecessary developing liquid remaining after development is then removed using a cleaning liquid such as pure water (see FIG. 9B). The banks 25 are thus formed by the wet process, as in Embodiment 1.

When forming the banks 25, it is unnecessary to provide a separate resist if the banks themselves are photosensitive. Wet etching may also be unnecessary.

In an embodiment in which the banks are not photosensitive, and a resist is used, the apertures between the banks are exposed to a removal liquid used to remove the resist after etching of the banks. At this point, the protective film 240 that is provided above the hole-injection layer 23 prevents the hole-injection layer 23 from being affected or damaged by the resist removal liquid.

When forming the banks 25, at least a portion of the surface thereof may be provided with repellency so that ink used to form the light-emitting layer does not leak into an adjacent subpixel. In addition to using a material having repellency to form the banks 25, it is also possible, as a method of providing repellency, to cause a fluorine component to be exposed on the surface of the banks 25 via plasma treatment (i.e. turning the surface into Teflon).

In this case, it is also possible to fluorinate the surface of the banks during plasma treatment in a gas environment that includes fluorine.

In addition to polyimide, the banks 25 may be formed from an organic material such as acrylic resin, novolac-type phenolic resin, or the like, as in Embodiment 1.

Dry etching may be used to form the banks 25. In this case as well, the protective film 240 is useful for preventing impurities from adhering to the surface of the hole transporting layer 30 located below the protective film 240. In addition to a negative material, a positive material may also be used for the banks.

Figure 9C:
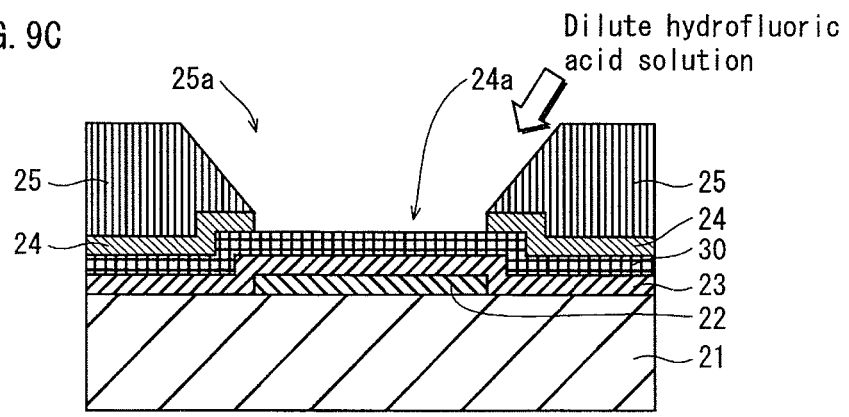

As shown in FIG. 9C, the portion of the protective film 240 at the lower portion of each aperture 25a in the banks 25 is then removed. In this condition, the protective film 24 is layered between the lower portion of the banks 25 and the hole transporting layer 30, and a portion of the hole transporting layer 30 is exposed through the aperture 24a in the protective film 24. Note that removal of $SiO_2$ can be performed by etching with a dilute hydrofluoric acid solution.

Like the hole-injection layer 3 in Embodiment 1, the hole transporting layer 30 is not dissolved by the dilute hydrofluoric acid solution during the above etching, since the dilute hydrofluoric acid solution is acidic.

In the method of manufacturing according to Embodiment 2, the light-emitting layer is layered on the hole transporting layer 30. At this point, in the method of manufacturing according to Embodiment 2, the hole transporting layer 30 is also formed with the metal compound, and therefore the hole transporting layer 30 is protected by the protective film 240 during formation of the banks 25.

Accordingly, a light-emitting device manufacture using the method according to Embodiment 2 also has strong light-emitting characteristics, since no impurities are located between the hole transporting layer 30 and the light-emitting layer, and the dimensional accuracy of the hole transporting layer 30 is guaranteed to a high degree of precision.

[Embodiment 3]

The following describes a method of manufacturing a light-emitting device according to Embodiment 3 with reference to FIGS. 10A through 11C. Note that FIGS. 10A through 11C show processes corresponding to the processes of the method of manufacturing according to Embodiment 1 as respectively shown in FIGS. 1A through 2C.

Figure 10A:
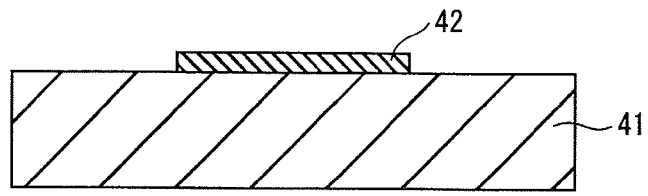
FIGS. 10A-10D are schematic cross-section diagrams showing, in order, a portion of manufacturing processes of a light-emitting device according to Embodiment 3.
Figure 10B:
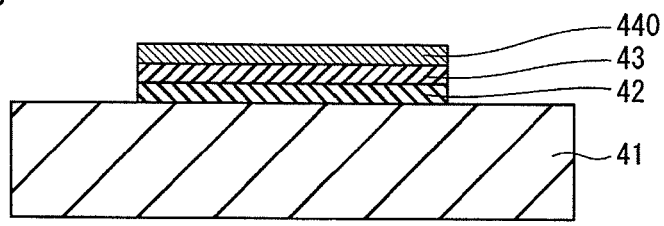

As shown in FIG. 10A, a plurality of anodes 42 are first formed on the upper surface in the direction of the Z axis of a substrate 41. In Embodiment 3 as well, the anodes 42 are formed at a distance from each other. Next, as shown in FIG. 10B, a hole-injection layer 43 and a protective film 440 are layered in this order on the upper surface of the anode 42 in the direction of the Z axis.

Note that in Embodiment 3, unlike Embodiments 1 and 2, the hole-injection layer 43 and the protective film 440 are selectively layered on the upper surface of the anode 42 while not being formed on the remaining surface of the substrate 41.

Figure 10C:
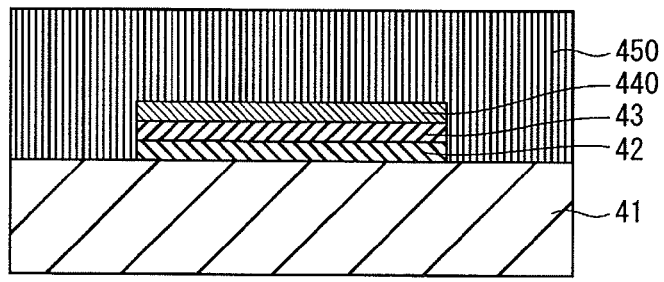

Next, as shown in FIG. 10C, a bank preparation film 450 is formed by deposition to entirely cover the protective film 240 and the exposed portions of the main surface of the substrate 41. The material for forming the bank preparation film 450 may be an insulating organic material such as polyimide, as in Embodiments 1 and 2. The bank preparation film 450 is formed in the same way as in Embodiments 1 and 2.

Figure 10D:
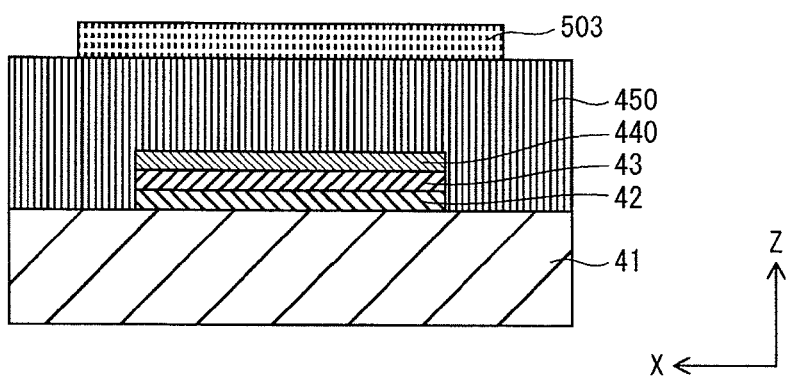

Then, as shown in FIG. 10D, a mask 503 is formed on portions of the bank preparation film 450 (at locations in which apertures are to be provided), and the light-emitting device is exposed in this condition.

Figure 11A:
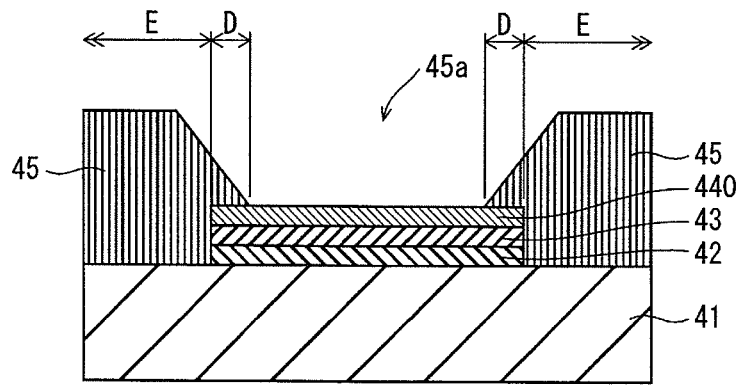
FIGS. 11A-11C are schematic cross-section diagrams showing, in order, a portion of manufacturing processes of a light-emitting device according to Embodiment 3.

Next, the exposed bank preparation film 450 is developed, and as shown in FIG. 11A, banks 45 are formed so as to enclose apertures 45a in locations corresponding to subpixels.

As shown in FIG. 11A, portions (D) of the banks 45 adjacent to the aperture 45a are layered on the protective film 440, whereas other portions (E) are layered on the substrate 41.

In the method of manufacturing according to Embodiment 3, the hole-injection layer 43 is also partitioned between adjacent subpixels, thereby reducing the effect of light emitted by adjacent subpixels. In the method of manufacturing according to Embodiment 3 as well, a metal compound (such as $WO_x$) is used for the hole-injection layer 43. As shown in FIG. 11A, the protective film 440, composed of $SiO_2$ or the like, is layered between the banks 45 and the upper surface of the hole-injection layer 43 in the direction of the Z axis, thus increasing adhesive properties between the banks 45 and the hole-injection layer 43.

As shown in FIG. 10B, in Embodiment 3, the protective film 440 and the hole-injection layer 43 are formed in the same pattern. In this case, it is possible to perform the photolithography processes together. In other words, it is possible to perform these processes with one mask.

Note that it is possible to compensate for the characteristic ease with which the edges of the hole-injection layer 43 become separated by allowing for the use of separate masks and forming the protective film 440 so as to cover the edges of the hole-injection layer 43.

Figure 11B:
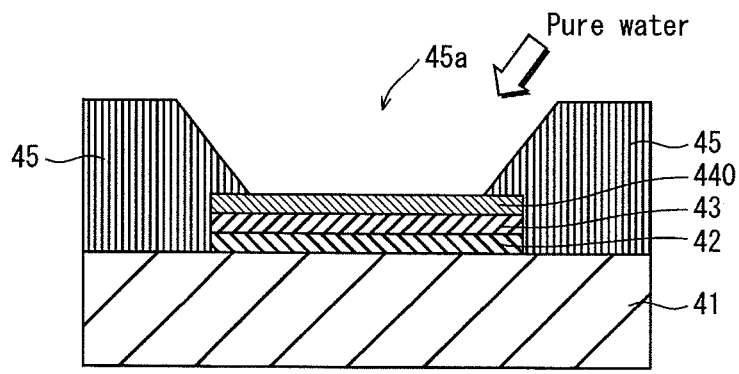

Next, as shown in FIG. 11B, after forming the banks 45 enclosing the apertures 45a, used developing liquid that is no longer necessary is then removed using a cleaning liquid such as pure water. The banks 45 are thus formed by the wet process, as in Embodiments 1 and 2.

When forming the banks 45, it is unnecessary to provide a separate resist if the banks themselves are photosensitive. Wet etching may also be unnecessary.

In Embodiment 3 as well, when forming the banks 45, at least a portion of the surface thereof may be provided with repellency so that ink used to form the light-emitting layer does not leak into an adjacent subpixel. Methods for providing repellency are the same as above.

The material and the method used to form the banks 45 are the same as in Embodiments 1 and 2.

Figure 11C:
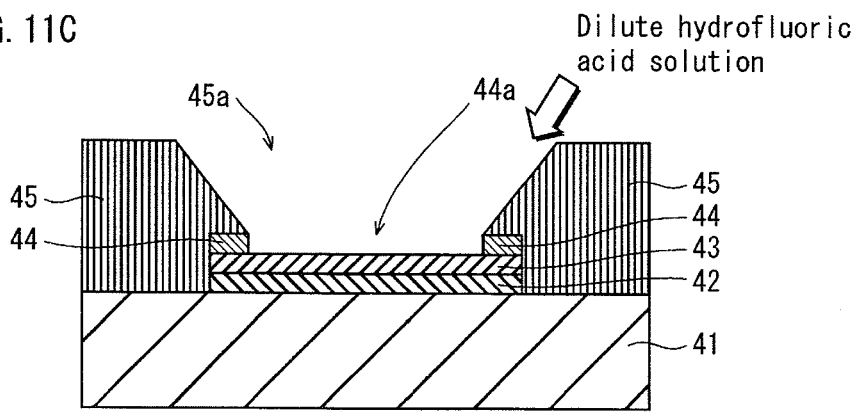

As shown in FIG. 11C, the portion of the protective film 440 at the lower portion of each aperture 45a in the banks 45 is then removed. In this condition, the protective film 44 is layered between the lower portion of the banks 45 (portions D in FIG. 11a) and the hole-injection layer 43, and a portion of the hole-injection layer 43 is exposed through the aperture 44a in the protective film 44. Note that removal of $SiO_2$ can be performed by etching with a dilute hydrofluoric acid solution.

In the method of manufacturing according to Embodiment 3 as well, a light-emitting layer, an electron injection layer, a cathode, a passivation layer, and the like are subsequently layered in this order to complete the light-emitting device (see FIGS. 3A-3D).

[Supplementary Explanation Regarding Formation of Banks]

In Embodiment 1, as shown in FIG. 5, the banks 5 are pixel banks (grid-shaped banks) in plan view. Alternatively, however, the banks 5 may be line banks. Supplementary explanation is provided for the plan view shape of the banks with reference to FIG. 12.

(Line Banks)

Figure 12:
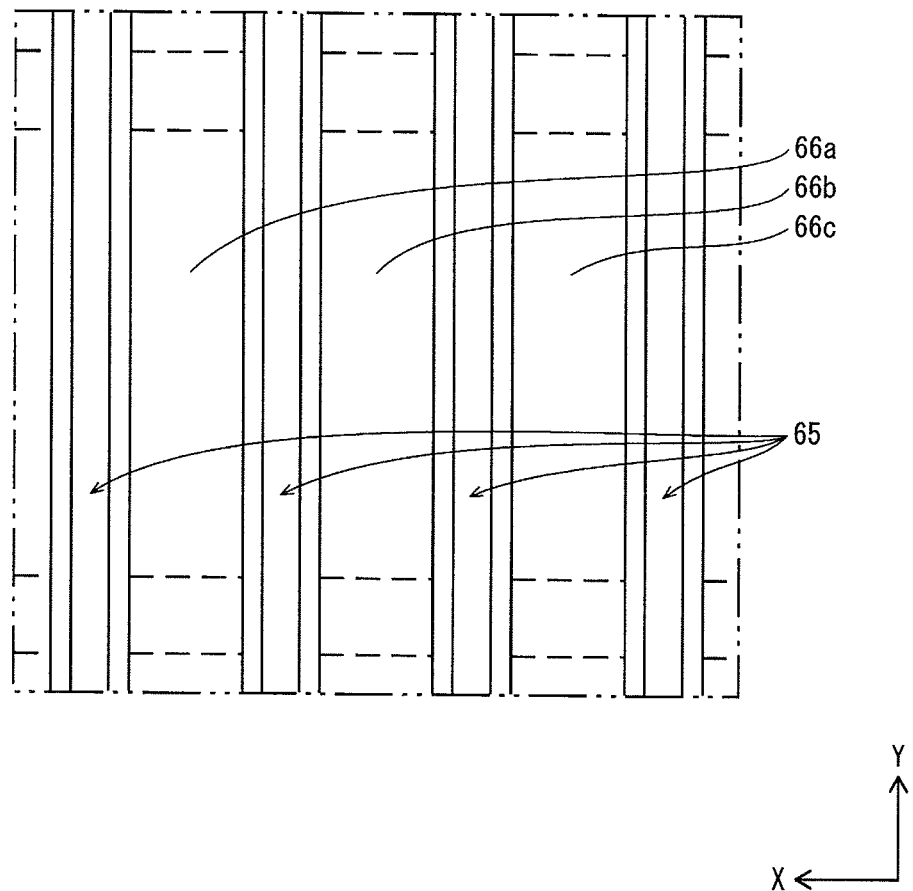
FIG. 12 is a schematic plan view of the shape of banks according to a modification.

As shown in FIG. 12, when adopting banks forming lines (line banks) 65, the line banks 65 partition the light-emitting layers 66a, 66b, and 66c of pixels that are adjacent along the X axis.

Note that, as shown in FIG. 12, when adopting line banks 65, light-emitting layers in subpixels that are adjacent along the Y axis are not partitioned by bank elements. However, the mutual effect on emitted light can be moderated by the driving method, the size of the anodes and the distance therebetween, and other such factors.

[Other Considerations]

In Embodiments 1-3, the anodes 2, 22, and 42 are formed above the substrates 1, 21, and 41, respectively. However, cathodes may be formed above the substrates, and anodes may be formed in an upper portion of the laminate. When adopting this structure, electron injection layers and electron transport layers, or electron injection/transport layers, are formed on the cathodes and covered with protective films 40, 240, and 440, after which the banks 5, 25, and 45 are formed. In this case as well, corrosion by liquid, as well as impurities adhering to the electron injection layers due to formation of the banks 5, 25, and 45, are reduced.

The light-emitting device 100 and the like according to Embodiments 1-3 are a top-emission type, yet a bottom-emission type may also be used.

The methods and materials used in the method of manufacturing according to Embodiments 1-3 are only examples, and the present invention is not limited to these examples.

INDUSTRIAL APPLICABILITY

The present invention is useful for achieving a light-emitting element that has strong light-emitting characteristics and is well-suited for use as a lighting device or a display device.

We claim:

1. A method of manufacturing a light-emitting element, comprising:
    forming a first electrode on a main surface of a substrate;
    forming a layer including a metal compound above at least the first electrode;
    covering at least the layer including the metal compound with a protective film;
    forming banks that define an aperture through which a portion of the protective film is exposed using a wet process on the protective film;
    removing the portion of the protective film exposed through the aperture so that a portion of the layer including the metal compound is exposed, and forming a light-emitting layer on the layer including the metal compound exposed through the aperture; and
    forming a second electrode of a polarity different from a polarity of the first electrode above the light-emitting layer, wherein the protective film is resistant to corrosion by a fluid employed in the wet process,
    wherein the wet process comprises developing to form the banks and cleaning the banks after the developing,
    wherein the removing of the portion of the protective film exposed through the aperture comprises removal of the portion of the protective film exposed through the aperture by etching and cleaning after the etching,
    wherein the protective film is not corroded by the fluid used during the wet process and liquids used during the developing and the cleaning after the developing, and is corroded by a first liquid used during the etching of the protective film in the removing of the portion of the protective film exposed through the aperture,
    wherein the layer including the metal compound is not corroded by the first liquid used during the etching of the protective film in the removing of the portion of the protective film exposed through the aperture, and is corroded by a second liquid used in the cleaning after the etching thus exposing an inner surface thereof, and
    the light-emitting layer is formed on the exposed inner surface of the layer including the metal compound.

2. A method of manufacturing a light-emitting element, comprising:
    forming a first electrode on a main surface of a substrate;
    forming a layer including a metal compound above at least the first electrode;
    covering at least the layer including the metal compound with a protective film;
    forming banks that define an aperture through which a portion of the protective film is exposed using a wet process on the protective film;
    removing the portion of the protective film exposed through the aperture so that a portion of the layer including the metal compound is exposed;
    removing the portion of the layer including the metal compound thus exposing a portion of an inner surface of the layer including the metal compound;
    forming the light-emitting layer on the exposed portion of the inner surface of the layer including the metal compound; and
    forming a second electrode of a polarity different from a polarity of the first electrode above the light-emitting layer, wherein the protective film is resistant to corrosion by a fluid employed in the wet process.

3. The method of claim 2, wherein the protective film is more resistant to corrosion by the fluid used during the wet process than the layer including the metal compound,
    wherein removing the portion of the protective film exposed through the aperture comprises removal by etching of the portion of the protective film exposed through the aperture, and
    wherein the layer including the metal compound is more resistant to corrosion than the protective film by a liquid used during the etching of the protective film in the removing the portion of the protective film exposed through the aperture.

4. The method of claim 2, wherein the protective film and the layer including the metal compound have different etching rates with respect to a same treatment liquid.

5. The method of claim 2, wherein the protective film has a lower etching rate than the layer including the metal compound with respect to the fluid used during the wet process,
    wherein removing the portion of the protective film exposed through the aperture comprises removal by etching of the portion of the protective film exposed through the aperture, and
    wherein the layer including the metal compound has a lower etching rate than the protective film with respect to a liquid used during the etching of the protective film in the removing the portion of the protective film exposed through the aperture.

6. The method of claim 5, wherein the wet process comprises developing to form the banks and cleaning after the developing,
    wherein removing the portion of the protective film exposed through the aperture comprises removal by etching of the portion of the protective film exposed through the aperture,
    wherein the protective film has a lower etching rate than the layer including the metal compound with respect to liquids used during developing and cleaning in forming the banks, and the layer including the metal compound has a lower etching rate than the protective film with respect to a liquid used during the etching of the protective film in the wet process.

7. The method of claim 2, further comprising:
removing the portion of the protective film exposed through the aperture, while portions of the protective film corresponding to the banks are left without being removed.

8. The method of claim 2, further comprising forming the protective film from an insulating material.

9. The method of claim 2, further comprising forming the protective film from an inorganic material.

10. The method of claim 2, further comprising forming the protective film from $SiO_2$.

11. The method of claim 2, wherein the layer including the metal compound comprises a charge injection layer, and further comprising:
exposing the charge injection layer by the removing of the portion of the protective film exposed through the aperture; and
layering the light-emitting layer on the charge injection layer.

12. The method of claim 2, further comprising forming the layer including the metal compound from one of a metal oxide, a metal nitride, and a metal nitride oxide.

13. The method of claim 2, further comprising forming the light-emitting layer from an organic coating material.

14. The method of claim 2, further comprising forming the light-emitting layer by an inkjet method.

15. A method of manufacturing a light-emitting device including a plurality of subpixels, the method comprising forming each subpixel with the method of manufacturing a light-emitting element of claim 2.

16. A method of manufacturing a light-emitting element, comprising:
forming a first electrode on a main surface of a substrate;
forming a layer including a metal compound above at least the first electrode;
covering at least the layer including the metal compound with a protective film;
forming banks that define an aperture through which a portion of the protective film is exposed using a wet process on the protective film;
removing the portion of the protective film exposed through the aperture so that a portion of the layer including the metal compound is exposed;
removing the portion of the layer including the metal compound so that a portion of an inner surface of the layer including the metal compound is exposed;
forming an organic material layer on the exposed portion of the inner surface of the layer including the metal compound; and
forming a second electrode of a polarity different from a polarity of the first electrode above the organic material layer,
wherein the protective film is resistant to corrosion by a fluid employed in the wet process.

* * * * *